(12) United States Patent
Leather et al.

(10) Patent No.: US 7,928,906 B2
(45) Date of Patent: Apr. 19, 2011

(54) ANTENNA MEASUREMENT SYSTEMS

(75) Inventors: Paul Simon Holt Leather, Pyrenees Orientales (FR); John David Parsons, Merseyside (GB)

(73) Assignee: Fizzle Holding Limited, Douglas (IM)

( * ) Notice: Subject to any disclaimer, the term of this patent is extended or adjusted under 35 U.S.C. 154(b) by 1207 days.

(21) Appl. No.: 10/499,862

(22) PCT Filed: Dec. 19, 2002

(86) PCT No.: PCT/GB02/05793
§ 371 (c)(1),
(2), (4) Date: Sep. 8, 2005

(87) PCT Pub. No.: WO03/056349
PCT Pub. Date: Jul. 10, 2003

(65) Prior Publication Data
US 2006/0055592 A1    Mar. 16, 2006

(30) Foreign Application Priority Data
Dec. 21, 2001  (GB) .................................. 0130842.8

(51) Int. Cl.
*H01Q 3/00* (2006.01)
(52) U.S. Cl. ........................................................ 342/360
(58) Field of Classification Search ................. 342/169, 342/165, 173–174, 359–368
See application file for complete search history.

(56) References Cited

U.S. PATENT DOCUMENTS

| | | | |
|---|---|---|---|
| 4,740,790 A * | 4/1988 | Hess et al. ..................... | 342/361 |
| 5,311,440 A * | 5/1994 | Hess, Jr. ......................... | 324/615 |
| 6,184,826 B1 | 2/2001 | Walley et al. ................. | 342/360 |
| 6,236,362 B1 | 5/2001 | Walley et al. ................. | 342/360 |
| 6,236,363 B1 * | 5/2001 | Robbins et al. ............... | 342/360 |
| 7,286,855 B2 * | 10/2007 | Raleigh et al. ............. | 455/562.1 |

(Continued)

FOREIGN PATENT DOCUMENTS

BA          97/38464         10/2007

OTHER PUBLICATIONS

Jefferay T. Williams, "An Anteena Pattern measurement Technique For Eliminating the Fields Scattered From the Edges of a Finite Ground Plane", 1990, IEEE.*

(Continued)

*Primary Examiner* — Thomas H Tarcza
*Assistant Examiner* — Nga X Nguyen
(74) *Attorney, Agent, or Firm* — Reed Smith LLP; Carl H. Pierce

(57) ABSTRACT

An antenna measurement range and a method of calibrating same is proposed which at least substantially reduces the effects of echoing or multi path. The method of calibrating the range comprises the steps of: generating and radiating a training signal; receiving the radiated training signal and comparing the received signal with the expected signal; determining a set of equalizer coefficients to be used in these circumstances to eliminate or minimize the error between the expected training signal and the received signal; and storing the set of equalization coefficients and associating them with the rotational or translational position of the antenna under test so that the coefficients can be applied to subsequent radiation pattern measurements. In one embodiment, the measurement nodes are dispersed in a three dimensional array about the antenna under test and a set of coefficients arrived at for each node to be applied to the subsequent radiation pattern measurements.

26 Claims, 8 Drawing Sheets

U.S. PATENT DOCUMENTS

2001/0028323 A1* 10/2001 Walley et al. .............. 342/360

OTHER PUBLICATIONS

Jeffery T. Williams "An Antenna Pattern Measurement Technique For Eliminating the Field Scattered From The Edges of A Finite Ground Plane", 1990 IEEE.*

Jeffery T. Williams, "An Antenna Pattern Measurement Technique For Eliminating the Fields Scattered From the Edges of a Finite Ground Plane", 1990, IEEE.*

Williams, "Antenna Patern Measurement Techniquie For Eliminating the Field Scattered From The Edges of a Finite Ground Plane", 1990 IEEE.*

U. Karthaus et al. , First International Symposium on Communication and Digital Signal Processing, published 1998, pp. 305-308, "Innovative Low-Cost Antenna Measurement Method.".

G. Hindman et al., Antenna Measurement Techniques Association Conference, Published 1989, "Error Suppression Techniques for Nearfield Antenna Measurements." http://www.nearfiled.com/amta/amta89_3.htm.

* cited by examiner

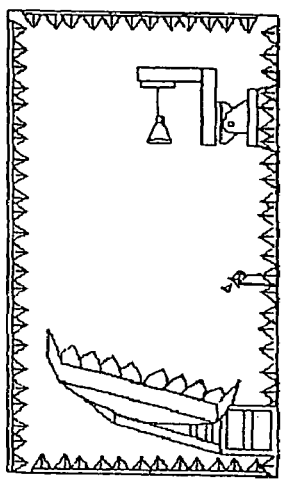
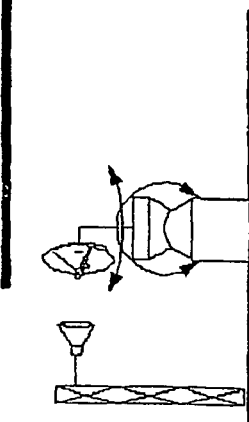
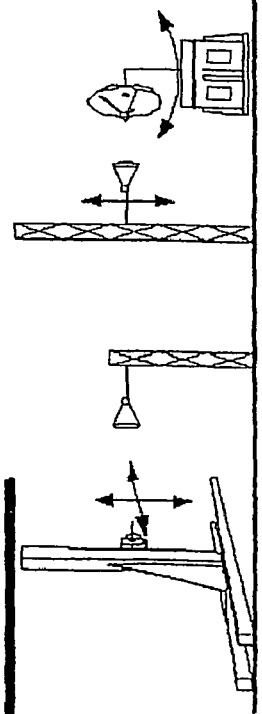
FIG.1a
FIG.1b
FIG.1c
FIG.1d
FIG.1e
FIG.1f
FIG.1g

ANTENNA MEASUREMENT SYSTEMS

PRIORITY INFORMATION

The present application claims priority from PCT Application Ser. No. PCT/GB02/05793, filed on Dec. 19, 2002, which claims priority from Great Britain Patent Application Ser. No. 0130842.8, filed Dec. 21, 2001. The contents of these applications are incorporated herein in their entireties by reference thereto.

FIELD OF THE INVENTION

The present invention relates to the measurement of antenna radiation patterns.

BACKGROUND OF THE INVENTION

By definition, radio communication systems contain antennas that serve as transducers between the radio frequency (RF) energy within the system and the radiated energy between systems. The antennas used must be compatible with the requirements of the particular RF system. While this results in a variety of designs for various communication systems, most antennas can be characterized by a common set of antenna performance parameters.

In order to select or design an antenna suitable for a given communication system, it is necessary to know, or be able to measure, the performance of the various alternatives. Typically, antenna performance parameters include input impedance, polarization, directivity, radiation efficiency, gain, and radiation pattern.

The transfer of RF power from an antenna to a communication system and vice versa is related to the input impedance of the antenna and the impedance of the communication system. The impedance match of the antenna and the system is thus of primary importance. The polarization of an antenna is defined as the polarization of the electromagnetic wave radiated by the antenna along a vector originating at the antenna and pointed along the primary direction of propagation. The directivity of an antenna is defined as $4\pi$ times the ratio of the maximum radiation intensity (power radiated per unit solid angle) to the total power radiated by the antenna. The gain of an antenna is a measure of its ability to concentrate its radiated power in a particular direction. The radiation efficiency of an antenna is the ratio of the power radiated by the antenna to the net power accepted at its input.

Antenna radiation patterns are graphical representations of the directional distribution of energy radiated from the antenna. Radiation patterns can be plotted in terms of field strength, power density, or decibels. They can be absolute or relative to some reference level, with the peak of the beam often chosen as the reference. Radiation patterns can be displayed in rectangular or polar forms as functions of the spherical coordinates, $\theta$ and $\Phi$;. It is fundamentally important to state that reciprocity applies, i.e. although the performance parameters of an antenna have been explicitly defined above in terms of the antenna as a source of radiation, the parameters (polarization, directivity, gain and radiation pattern) are the same whether the antenna is used for transmission or reception. Reciprocity is implicit in the descriptions and claims below; it is irrelevant whether a particular antenna is used for transmission or reception.

Antenna radiation-pattern measurements are traditionally performed using outdoor antenna ranges and indoor anechoic chambers. The choice of facility is influenced by a number of factors that include operating frequency, the size of the antenna or object to be measured, throughput or measurement speed, and the required measurement accuracy. An antenna range is a costly facility that requires specialist design and construction skills, space, regular maintenance and calibration, skilled personnel and resource management.

For both outdoor and indoor measurements of either the far-field or near-field components of an antenna's radiation pattern, it is important that neither the antenna under test (AUT) nor the range antenna (RA) itself are affected by unwanted signals or stray energy. Examples of stray energy include: interference from extraneous electrical, radio and microwave sources and reflections of the measured or wanted signal itself, hereinafter referred to as multipath.

When the AUT is used in the reception mode, accurate measurement of its far-field radiation pattern ideally requires zero variation in the amplitude and phase of the incident field at a given frequency across its aperture. For many measurements, however, a wave front with less than 22.5° of phase variation is considered sufficient. This is achieved by making the distance between the two antennas (the range antenna and the antenna under test) sufficiently large. Nevertheless, in practice it is desirable to make antenna measurements using a minimal separation distance consistent with obtaining the required accuracy. Small phase deviations result in minor distortions of the measured sidelobe structure while larger deviations cause major errors in the measured gain and lobe structure. This condition can also mask asymmetrical sidelobe structures that are actually present.

Large separation distances, as mentioned above, increase the probability of unwanted multipath reflections from the ground and other scatterers, reaching the antenna under test. Traditionally, in outdoor ranges, multipath reflections are reduced by employing one or more of the following methods: elevating the range antenna and the antenna under test; using directive range antennas; removing or reducing clutter and scattering surfaces; and adding screens or baffles to intercept reflected waves. An alternative procedure requires the use of a flat range and includes the effect of specular ground reflections.

In cases where the length of the antenna range is reasonably short, the entire range can be housed indoors in an anechoic chamber. The basic design criteria for both indoor far-field and near-field anechoic chambers are the same as those for an outdoor range. However, to eliminate, or at least minimise reflections, the surfaces of the chamber are covered with radio frequency (RF) or microwave absorbing material. The absorber is designed to reduce reflected signals over a specified range of frequencies. Amongst the many advantages offered by indoor testing are improved security, avoidance of unwanted surveillance and the elimination of meteorological and other environmental factors. These advantages have accounted for the recent trend towards more sophisticated indoor facilities that employ compact ranges or near-field probing systems.

SUMMARY OF THE INVENTION

It is the aim of the present invention to provide an antenna measurement system that eliminates, or at least substantially reduces, the effects of echoing or multipath.

An object of the invention is to provide a mechanism for the robust, accurate, and efficient measurement of antenna radiation patterns. Another object of a specific embodiment of the invention is to provide an antenna radiation pattern measurement system that performs antenna radiation pattern measurements in real-time with no moving parts.

In essence, the invention provides accurate and robust antenna radiation pattern measurements by specifically correcting for the effects of unwanted signals and noise, rather than by attempting to remove, or minimise, such effects through the use of screens or baffles or by using an anechoic chamber.

Accordingly, one aspect of the present invention provides an antenna measurement range incorporating an equalisation unit which is operable to generate an equalised (or corrected) version of a measured signal.

In general terms an equaliser is an electronic circuit that can be set up to correct for imperfections in a radio propagation channel. In the context of antenna measurements it can be set up to correct for the effects of multipath propagation in the radio channel that exists in the antenna measurement range.

In an ideal, no-multipath, situation the radio channel that exists in the antenna range is characterized by an amplitude response that is independent of frequency and a phase response that is a linear function of frequency. Multipath causes the amplitude response to become frequency-dependent and the phase response to become non-linear.

In the invention described, an equaliser is used. The aim of the equaliser is to restore the channel characteristics as near as possible to the ideal characteristics described above, thereby implicitly correcting for the multipath effects. To do this, the equaliser has to calculate the actual channel characteristics and adjust its coefficients appropriately. This it does during a training mode which precedes the actual radiation pattern measurement.

The modes of operation of an (adaptive) equaliser include a training mode in which a predetermined signal, typically a pseudo-random binary sequence, or a fixed, prescribed, bit pattern is sent over the radio channel. Because the bit sequence is known, the equaliser can use a recursive algorithm, such as the least mean squares (LMS) algorithm, to adjust its coefficients so that the error between the desired and actual outputs is minimised. As an example, a generic equaliser can take the form of a tapped delay line filter having a set of coefficients $W_O$-$W_N$; however there are several other equaliser structures, including neural networks, and other algorithms, that can be used to achieve the same effect.

The training procedure sets up the equalisation unit to take account of distortions that are introduced into the measured signal as a result of the configuration and/or design and/or operational environment of the antenna measurement range employed. In other words, training allows the coefficients of the equaliser to be set up so as to remove the effects of unwanted signals and stray energy. Subsequent tests will therefore produce a measured radiation pattern that is an accurate representation of the true radiation pattern of the antenna under test (AUT).

Since the tests are aimed at measuring the radiation pattern, antenna ranges that rely on the rotation or translation (in 2 or 3 dimensions) of either a single range antenna or AUT, are able to utilise a number of sets of equalisation values, each set corresponding to the rotational position of either the range antenna or the AUT as the case may be. Accordingly, means is provided for rotating or translating either the antenna under test or the range antenna, and means is provided for associating the position of the range antenna or the AUT with the appropriate set of equaliser coefficients. The increments between measurements will be indicated by the desired accuracy of the radiation pattern measurement.

Accordingly, means is provided for generating a training signal, means is provided for comparing the signal received with the expected (training) signal radiated, means is provided for determining a set of equalisation coefficients to eliminate or minimise the error between the training signal and the received signal, and means is provided for storing the equalisation coefficients.

A specific embodiment of the invention avoids the need for rotation or translation of the range antenna or the AUT by providing apparatus comprising a plurality of spaced measuring nodes to receive signals from the AUT; this apparatus replaces the range antenna. In this case a specific set of equaliser coefficients is associated with each node. The plurality of measurement nodes may be arranged in a two or three dimensional pattern. It is preferred that they are all disposed at the same distance from the AUT.

The invention may be applied to existing outdoor and indoor measurement ranges and to a new form of antenna measurement range that does not require an anechoic chamber. A further embodiment of the system and method provides a means for reducing the time taken to measure the radiation pattern of the antenna.

Another aspect of the invention provides a method of calibrating an antenna measurement range provided with signal equalisation means and comprising an antenna under test and at least one range antenna or measurement node, the method comprising the steps of: positioning the antenna under test in the range and (i) radiating a training signal;
(ii) receiving the radiated training signal and comparing the received signal with the expected training signal;
(iii) determining a set of equaliser coefficients to be used in these circumstances to eliminate or minimise the error between the expected training signal and the received signal;
(iv) storing the set of equalisation coefficients and associating it with the rotational or translational position of the antenna under test so that the coefficients can be applied to subsequent radiation pattern measurements for that relative rotational or translational position.

In one embodiment, the method further comprises rotating the position of the antenna under test to successive positions relative to the at least one range antenna or measurement node; noting the successive relative positions, and for each position repeating steps (i) to (iv) in turn to generate a set of equaliser coefficients for each position, so that respective coefficients can be applied to subsequent radiation pattern measurements for the rotational position concerned.

Thus several sets of equaliser coefficients are stored and associated with the various different positions of the antenna.

The training signal may be a bit sequence as discussed hereinbefore. Preferably the training signal is radiated by the antenna under test. Where relative rotation is required between the antenna under test and the range antenna it is preferred that the antenna under test is rotated.

When the range is one that incorporates a plurality of measurement nodes to receive signals from the antenna under test, the set of coefficients associated with each measurement node may be determined without the need for rotation or translation. It is important that the bandwidth of the training signal is appropriate for the specific antenna under test.

Depending on the equaliser implementation, the calibration process may also incorporate measurements made with and without the equaliser, using a calibration antenna having well-defined characteristics, for example, a standard gain horn. These measurements may be gain measurements.

It is envisaged that the equalisation coefficients will be mathematically complex.

In order to ensure that the predefined nominal characteristics of the training signal and any signal subsequently used for measurement purposes are maintained over time, direct measurements or pre-characterization of the signal generators over variables such as temperature and frequency is utilized in preferred embodiments of the invention.

The invention is generally applicable and may be implemented within any antenna radiation pattern measurement system where accuracy is required. For example, the invention may be implemented in existing antenna measurement ranges as an additional feature comprising combinations of hardware and software. A fundamental advance is the implementation of the invention in new antenna measurement ranges designed so that an anechoic chamber is not required.

The invention is applicable to the equalisation of antenna radiation pattern measurement systems in which the measurement is either dependent on, or independent of frequency. In both cases, the measurement signal may, for example, take the form of a multi-tone signal, covering a suitable bandwidth, comprising tones regularly or arbitrarily spaced in frequency. In ranges where there is only one measurement node the measurement may be made for each rotational or translational position of the antenna immediately following the training of the equaliser at that antenna position; alternatively the various sets of coefficients may be stored and a subsequent series of measurements may be made. When a plurality of measurement nodes exists to avoid rotation or translation, a similar procedure may be followed for each node. However, when an individual equaliser is associated with each node, all equalisers can be trained at the same time and subsequently all measurements can also be made simultaneously.

The embodiments of the invention offer one or more of the following advantages:
Robust and efficient calibration;
Automatic calibration and correction during operation;
Application to existing outdoor and indoor antenna measurement ranges;
Application to new antenna measurement ranges thus eliminating the need for costly anechoic chambers and radio frequency absorbing material;
A multi-node measurement system operating in real-time;
Simplified construction.

Other advantages offered by the present invention will be appreciated upon the reading of the description below of the embodiments of the invention.

Thus, in contrast to prior art proposals which determine, and generate, a wave form that nullifies the effect of multipath signals (e.g. one having the multi-path signals subtracted therefrom), the present invention utilises equalisation coefficients in the hardware or software to remove the effects of multi-paths from the received test signal and the measurement signal. Thus the measurement signal used for arriving at the radiation pattern measurement does not have to be modified in any way.

BRIEF DESCRIPTION OF THE FIGURES

FIGS. 1a-1g show seven examples of the more commonly used antenna test ranges to which the invention may be applied;

DETAILED DESCRIPTION OF THE INVENTION

The invention is applicable to existing indoor and outdoor measurement ranges and typical examples of these are described briefly hereinafter and in particular how the present invention is applied thereto.

Referring firstly to FIGS. 1a-1g. Seven commonly used antenna ranges are illustrated. They comprise a rectangular anechoic chamber (FIG. 1a), a compact antenna test range (FIG. 1b), an outdoor elevated range (FIG. 1c), a ground reflecting range (FIG. 1d), a planar near-field test range (FIG. 1e), a cylindrical near-field test range (FIG. 1f), and a spherical near-field test range (FIG. 1g). Save for the changes that application of the present invention has, their construction and how they are used to test antennas is not described in any detail as it is well known in the art.

Figure 2:
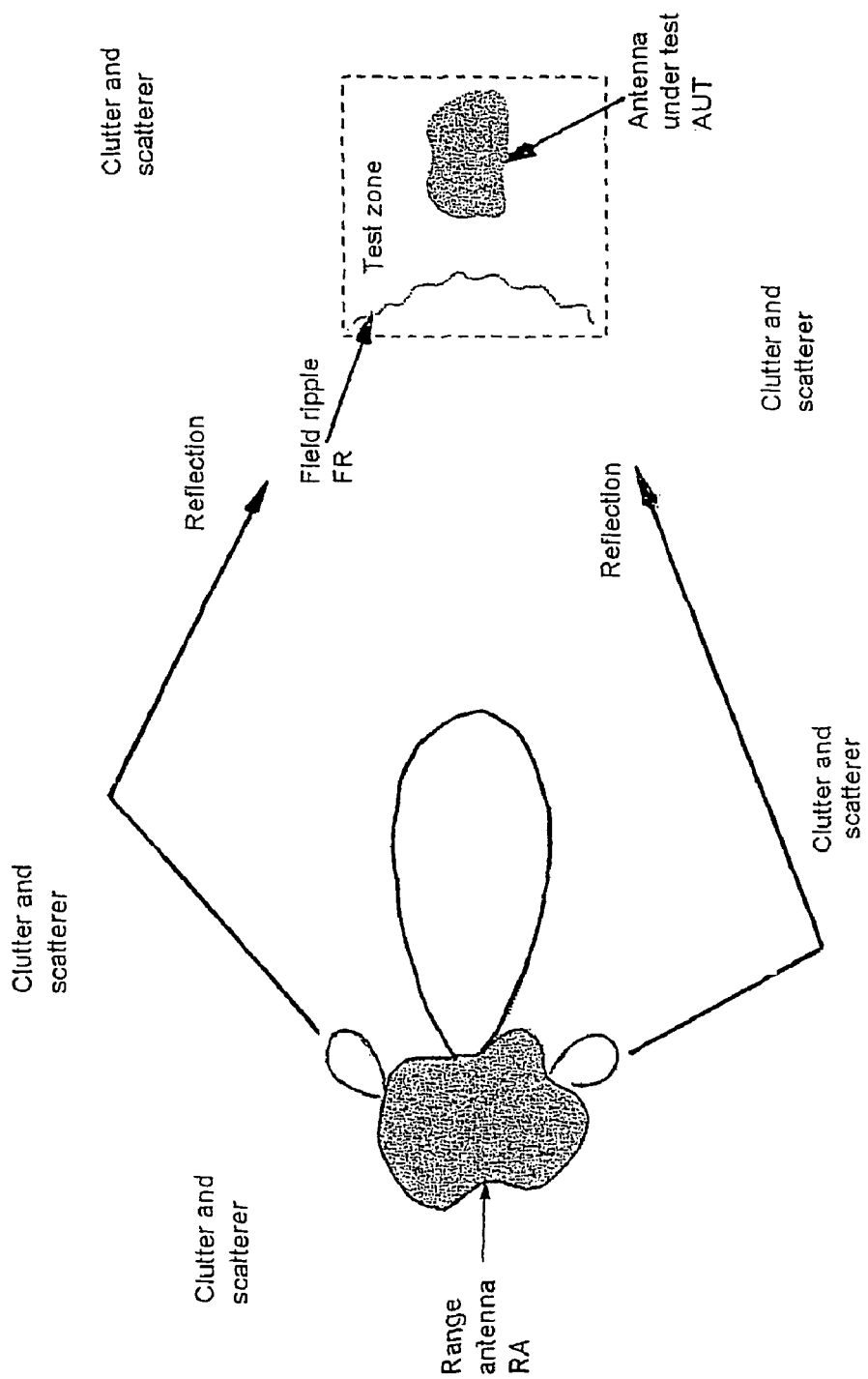
FIG. 2 is a simplified two-dimensional representation of an outdoor antenna measurement range showing the range antenna and the measurement object or antenna under test to which the invention may be applied.

FIG. 2 is a simplified two-dimensional representation of an outdoor antenna measurement range showing the range antenna RA and the measurement object or antenna under test AUT. In the test zone, the effect of multipath reflection and signal leakage is depicted diagrammatically as field ripple FR which may contain both phase and amplitude variations. The invention will effectively reduce this ripple as described further hereinafter.

Figure 3:
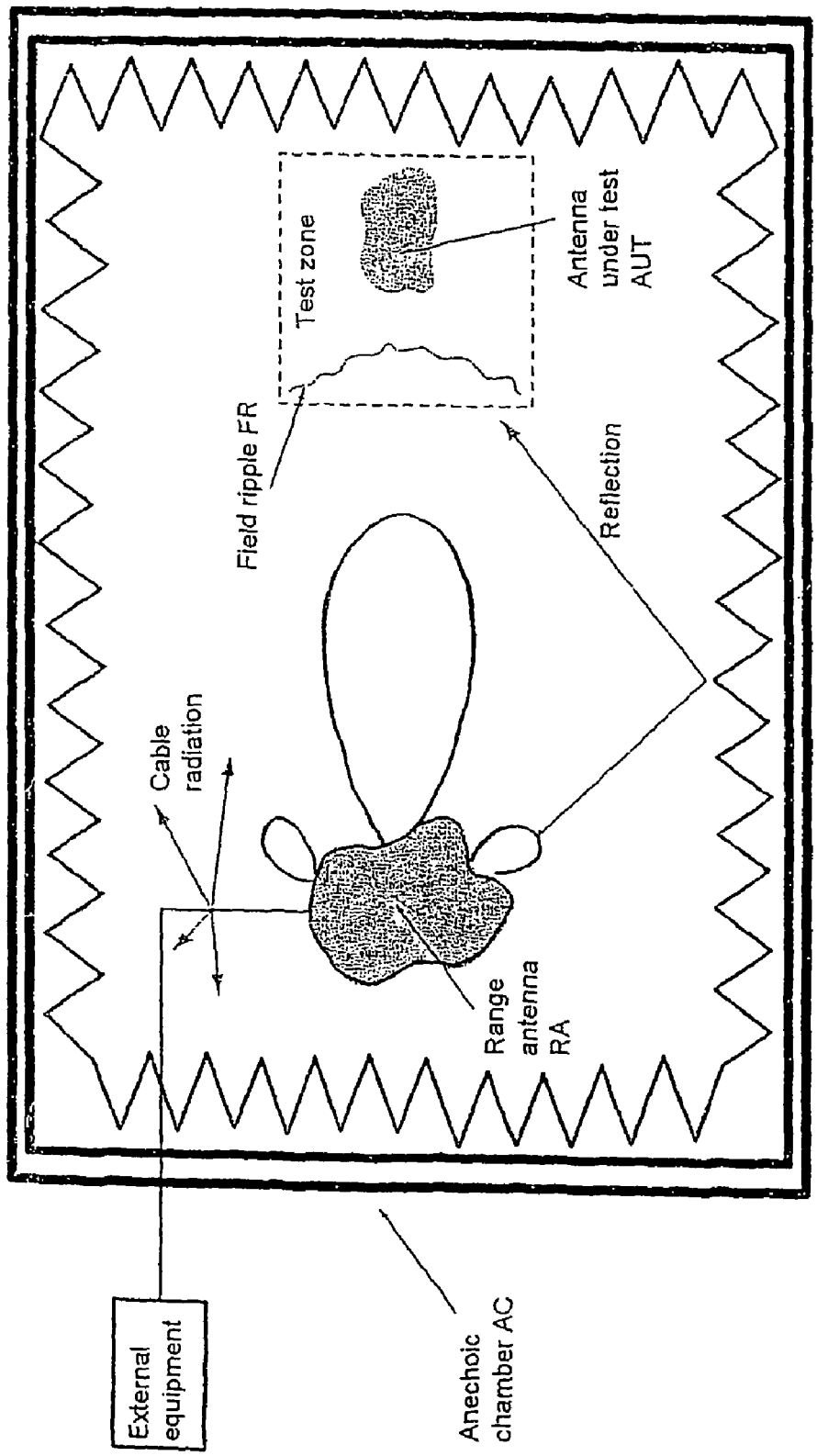
FIG. 3 is a simplified two-dimensional representation of an anechoic chamber showing the range antenna and the measurement object or antenna. under test to which the invention may be applied.

FIG. 3 is a simplified two-dimensional representation of an anechoic chamber AC showing the range antenna RA and the measurement object or antenna under test AUT. The chamber comprises a double-skinned room, lined with material designed to absorb radio frequency or microwave energy. In the so-called quiet zone or test zone, the effect of multipath reflection and signal leakage is again depicted as field ripple FR which may contain both phase and amplitude variations. The invention will effectively reduce this ripple as described hereinafter.

Figure 4A:
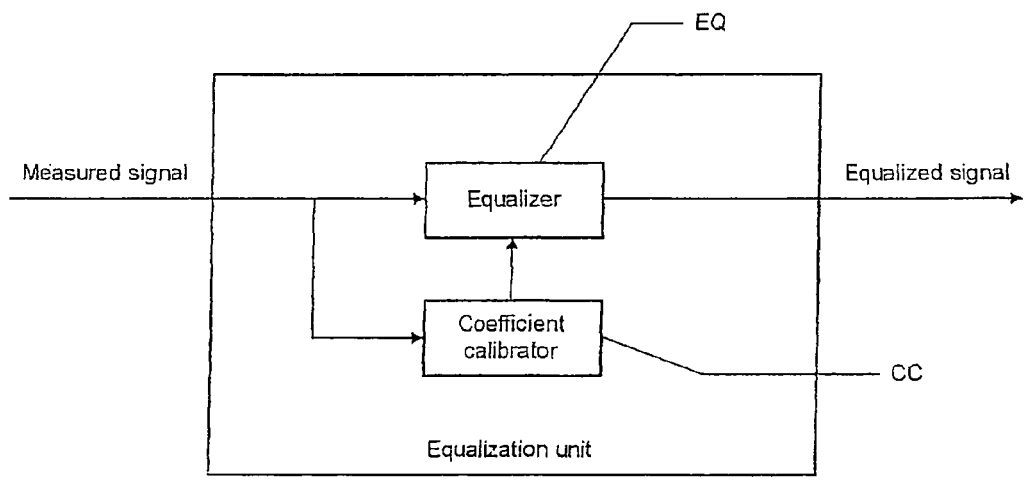
FIG. 4(a) is a block diagram illustrating schematically an equalisation unit.

FIG. 4(a) illustrates a simplified equalisation unit comprising a coefficient calibrator CC and an equaliser EQ. The coefficient calibrator determines the required set of equaliser coefficients using a priori knowledge of the transmitted training signal; these coefficients effectively equalise the amplitude and phase response of the propagation path and the output of the equaliser unit is thus an equalised (or corrected) version of the measured signal. In other words, the training procedure allows the determination of a set of equaliser coefficients that minimises the error between the expected and actual received signals; the equaliser is thus set up to correct for imperfections in the propagation channel so that the overall response has a flat amplitude response and a linear phase response over the bandwidth of the transmitted signal.

Figure 4B:
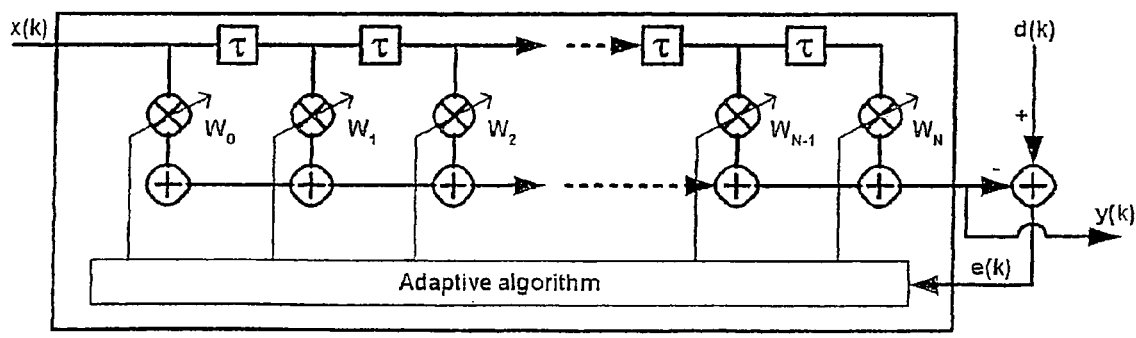
FIG. 4(b) is an example of a practical implementation of an equaliser in the form of a tapped delay line (transversal) filter.

The most explicit form of linear equaliser, in discrete form, is a tapped delay line (TDL) or transversal filter, as shown in FIG. 4(b), designed as an inverse filter for the channel. The input x(k), output y(k), desired output d(k) and error e(k) are all shown. It has a set of coefficients Wo-Wn, and a number of incremental time delays τ. In this form it is a finite impulse response (FIR) filter. However, there are other types of equaliser structure, and other algorithms, that achieve the same objective. Many of these are termed non-linear equalisers and are intrinsically adaptive in nature, i.e. the coefficients can be adjusted, by re-training, to compensate for a changed environment. These include decision feedback equalisers (DFE), filters using the recursive least square algorithm, and Kalman filters. Any suitable structure and algorithm can be used in this invention and the equaliser can be implemented in combinations of hardware and software at baseband, intermediate, or radio frequency. The equaliser may include a neural network as part of its structure, or may indeed actually be a neural network.

Any of the above equalisation systems referred to above may be used in the embodiments described and/or illustrated hereinafter.

In general, an antenna measurement range is comprised of at least two antennas: a range antenna RA and an antenna or antenna system under test AUT. In certain applications, the range antenna may be comprised of an array of antennas. Reciprocity holds in the case of radiation patterns (that is, the radiation pattern is the same for both the reception and transmission of signals) so the range antenna and the AUT can be employed either as the source (transmitting) or sensor (receiving) antenna or vice versa. Furthermore, either the range antenna or the AUT may be fixed or movable through the use of a positioning system P.

Figure 6:
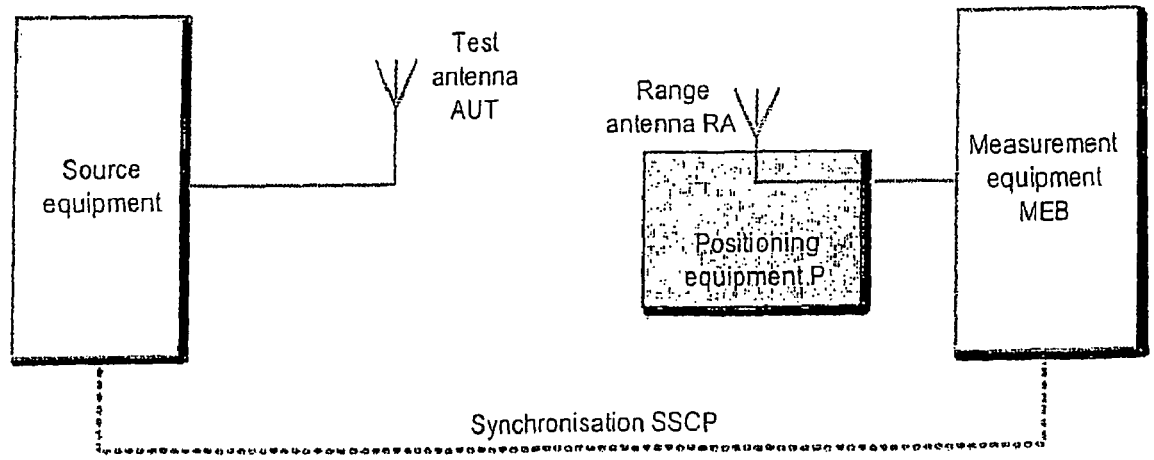
FIG. 6 is a diagrammatic representation of an antenna measurement range according to a second embodiment in which the test antenna is fixed and the range antenna may be positioned mechanically and to which the invention may be applied.
Figure 7:
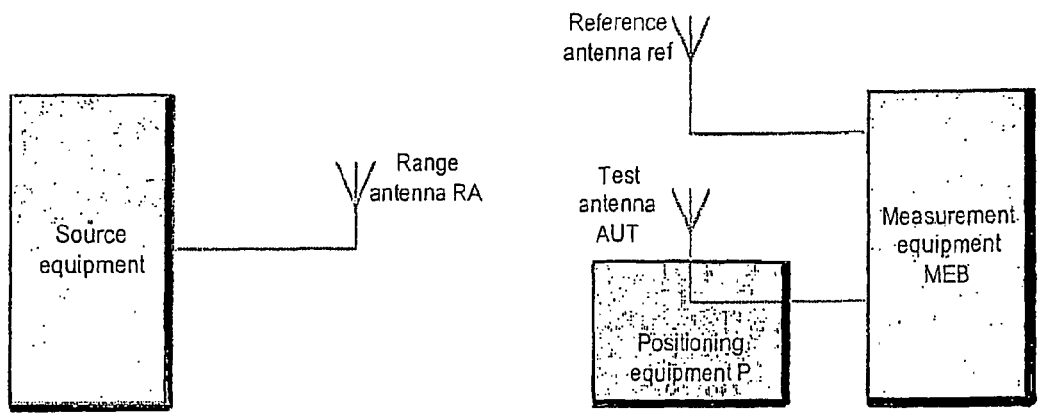
FIG. 7 is a diagrammatic representation of an antenna measurement range according to a third embodiment in which the range antenna is fixed and the test antenna may be positioned mechanically and to which the invention may be applied.
Figure 8:
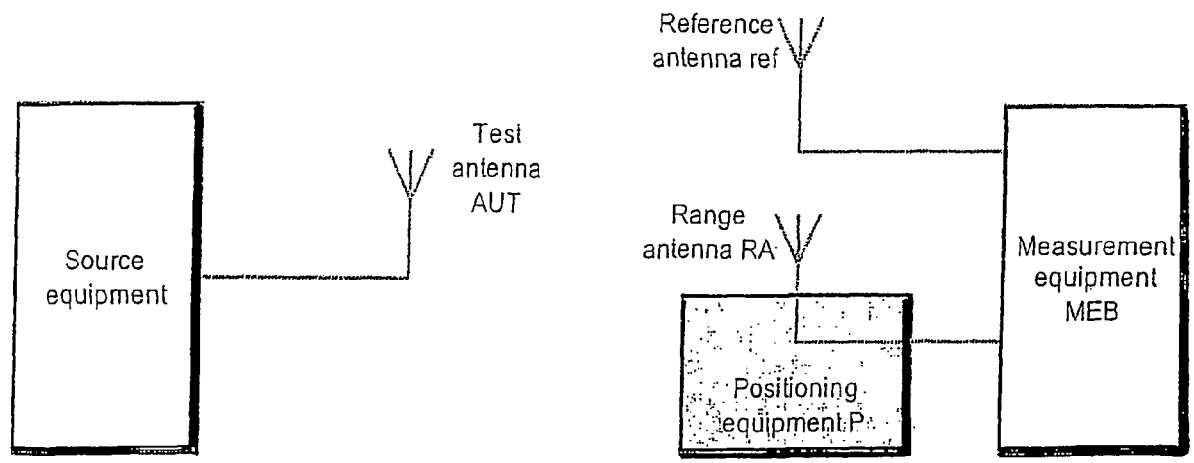
FIG. 8 is a diagrammatic representation of an antenna measurement range according to a fourth embodiment in which the test antenna is fixed and the range antenna may be positioned mechanically and to which the invention may be applied.

Signal synchronization is usually required between the source and measurement equipment and may be provided by either a conducted path SSCR (FIGS. 5 and 6) or by an air-interface link and a reference antenna REF (FIGS. 7 and 8). Practical issues often govern the choice of the aforementioned configurations for which examples are presented in FIGS. 5-8. An embodiment of the invention is the inclusion of the equalisation unit into the measurement equipment blocks MEB shown in FIGS. 5-8. To this end, the invention finds application as a retrofitted item to existing antenna measurement ranges, be they outdoor or indoor.

Figure 5:
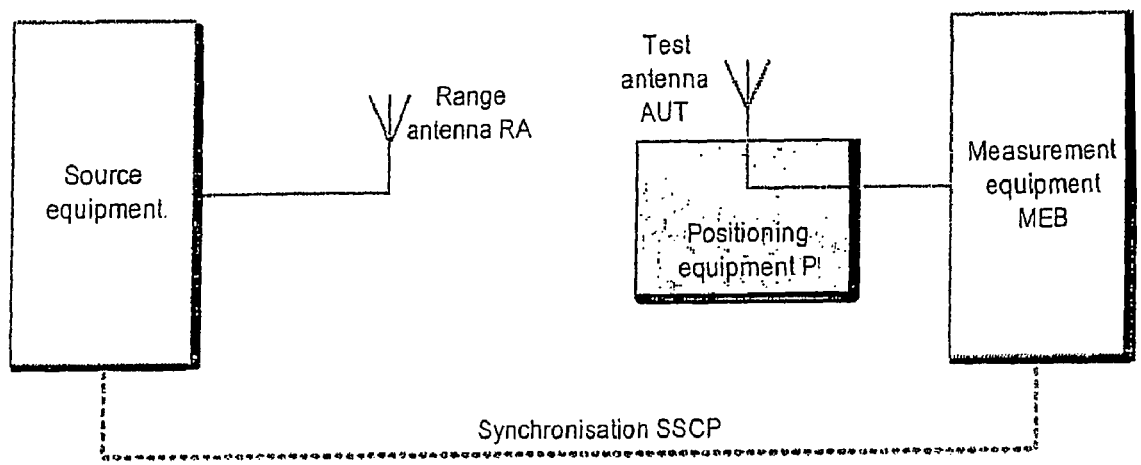
FIG. 5 is a diagrammatic representation of an antenna measurement range according to a first embodiment in which the range antenna is fixed and the test antenna may be positioned mechanically and to which the invention may be applied.

FIG. 5 is a diagrammatic representation of an antenna measurement range in which the range antenna RA is fixed and the test antenna AUT may be positioned mechanically. A synchronisation signal is provided by means of a link SSCP between the source equipment and the measurement equipment MEB. The invention is applicable to this type of antenna measurement in the form of additional functionality.

FIG. 6 is a diagrammatic representation of an antenna measurement range in which the test antenna AUT is fixed and the range antenna RA may be positioned mechanically. A synchronization signal is provided by means of a link SSCP between the source equipment and the measurement equipment. The invention is applicable to this type of antenna measurement in the form of additional functionality.

FIG. 7 is a diagrammatic representation of an antenna measurement range in which the range antenna RA is fixed and the test antenna AUT may be positioned mechanically. A separate signal is obtained from the reference antenna REF from which synchronization between the source equipment and the measurement equipment is made. The invention is applicable to this type of antenna measurement in the form of additional functionality.

FIG. 8 is a diagrammatic representation of an antenna measurement range in which the test antenna AUT is fixed and the range antenna RA may be positioned mechanically. A separate signal is obtained from the reference antenna REF from which synchronization between the source equipment and the measurement equipment is made. The invention is applicable to this type of antenna measurement in the form of additional functionality.

In relation to the embodiments of FIGS. 5-8, means is provided to generate a training signal, means is provided to compare the received signal with the expected training signal and to determine a set of equalisation coefficients that eliminate or minimise the error between the signals. Means is provided for storing the coefficients so determined.

In the case of the embodiment of FIGS. 5 and 7, rotation of the test antenna is required and in the case of FIGS. 6 and 8 rotation of the range antenna is required to arrive at a number of sets of equalisation coefficients for a range of rotational positions of the antenna under test relative to the range antenna. Thus in calibrating the antenna system, a series of training signals are radiated for different relative rotational positions thereof, and respective sets of equaliser coefficients determined and stored for those positions. The coefficients are applied to subsequent radiation pattern measurements for the relative rotational or translational position concerned.

A specific absorption rate (SAR) measurement system (not illustrated) is a special form of antenna measurement range that is commonly used for the assessment of the radiological health properties of mobile telephones and other personal wireless devices. In these examples, the device under test provides the source of radiation and a robotically-positioned probe measures the electromagnetic field in a defined region of space, for example within a liquid-filled model of a human head. The complete system is enclosed inside an anechoic chamber and requires careful calibration of the probe for accurate measurements. The invention is applicable to this type of measurement system in the form of additional functionality.

The invention provides a means of signal equalisation applicable to a wide variety of propagation channels encountered in both outdoor antenna ranges and anechoic chambers alike. In addition, the application of equalisation offered by the invention may also be applied to a new type of indoor antenna measurement system specifically designed not to need an anechoic chamber.

Figure 9:
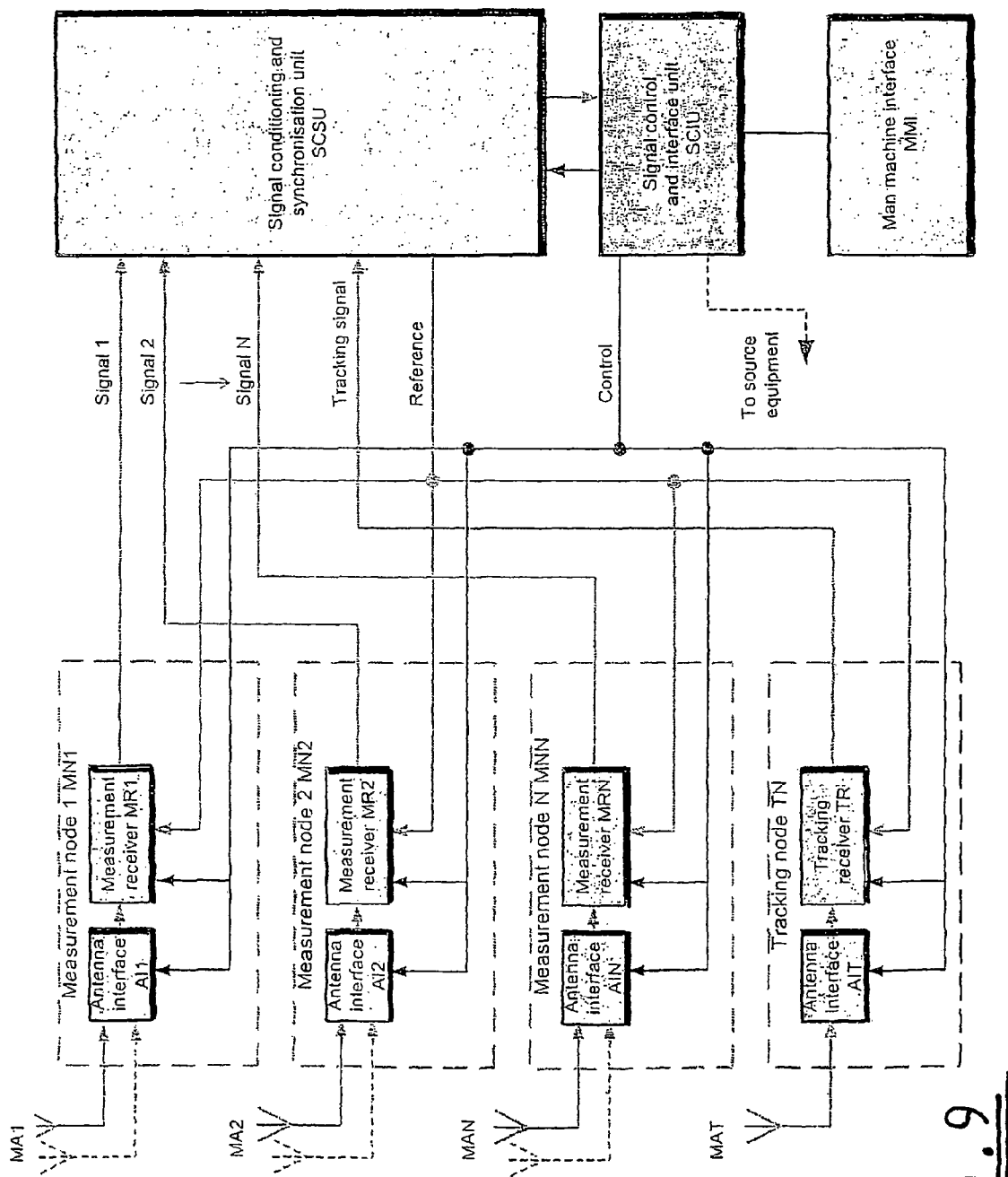
FIG. 9 is a diagrammatic representation of a multi-node measurement system architecture according to a preferred embodiment of the invention.

FIG. 9 presents a multi-node measurement system comprised of the following functional blocks: a number of measurement nodes MN1-MNN; a signal conditioning and synchronization unit SCSU; a signal control and interface unit SCIU; and a man machine interface MMI. Each measurement node contains a measurement receiver MR, an antenna interface AI and one or more measurement antennas (probes) MA. The probes in each measurement node provide a means for measuring specific characteristics of the transmitted signal (for example, polarization) or, in the embodiment of a system where the measurement bandwidth is greater than that of a single probe, a means for selecting the appropriate probe for a given frequency band.

In addition to the measurement nodes, an optional tracking node TN is included that contains an antenna interface AIT and a tracking receiver TR. The tracking receiver ensures synchronization between the transmitted signal and the measured signal.

All measurement nodes are controlled by, and synchronised to, the signal conditioning and synchronization unit (SCSU). Contained within the SCSU is an equalisation unit similar to that described earlier and presented in FIG. 4. A signal control and interface unit (SCIU) controls the SCSU and may be optionally connected to the source equipment. With the exception of the SCIU, all the aforementioned blocks may be likened to the measurement equipment blocks presented in FIGS. 5-8.

Figure 10:
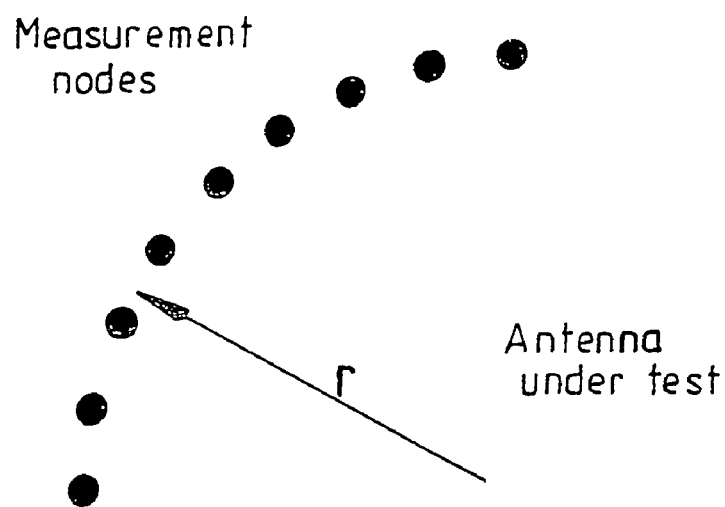
FIG. 10 illustrates an example of an arc of measurement nodes.

There is, however, one major difference between the system presented in FIG. 9 and the systems presented in FIGS. 5-8: the removal in a preferred embodiment of the need for a positioning system. Instead, the measurement nodes are arranged in such a manner that they "observe" all or part of the radiation pattern of the AUT without the need for either the range antenna or the AUT to move. In a few instances, it may only be necessary to measure the radiation pattern of an antenna over a restricted region of space such as an arc shown in FIG. 10 where the AUT is placed at the point from where the arc was scribed. The example illustrated in FIG. 10 comprises nine measurement nodes uniformly spaced along an arc of radius r from the centre of the measurement object or the antenna under test. An embodiment of the invention is to use measurement nodes arranged arbitrarily or uniformly in linear, planar or three-dimensional arrays, to suit specific purposes. In such an embodiment relative translation of the antenna under test may be required to arrive at spherical radiation pattern measurements. However, translation can be avoided where the measurement nodes are distributed in 3d space.

Figure 11:
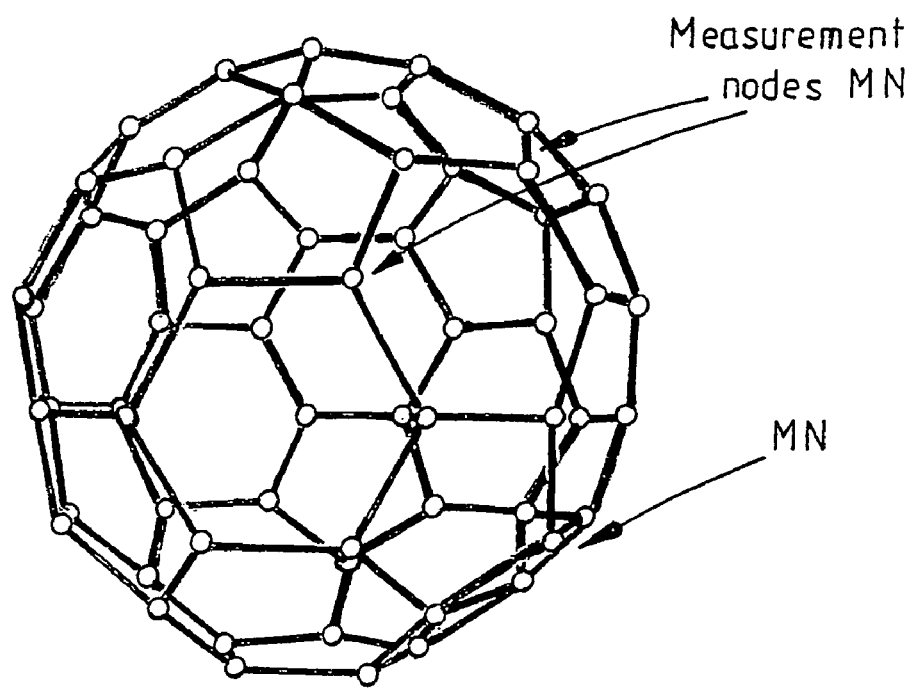
FIG. 11 is a perspective view of a truncated icosahedron in which the present invention may be embodied.

Spherical antenna pattern measurements require the observation nodes to be distributed in a volume of space described by a sphere. The distribution and number of measurement nodes will affect the resolution of the pattern measured. A preferred embodiment of the invention is a multiple measurement node system in which the nodes MN are positioned at the vertices of a polyhedron. A preferred example of a polyhedron exhibiting a high order of symmetry is the truncated icosahedron as shown in FIG. 11. However, there are other geometries that achieve the same objective. Any suitable geometry can be used in this invention. The connecting arms or rods facilitate mechanical construction and a conduit for electrical connections. The truncated icosahedron is comprised of sixty vertices, twelve pentagonal faces and fifteen hexagonal faces. The distance from any point to its nearest neighbors is the same for all the points. Each point has exactly three neighbors.

The multi-node antenna pattern measurement system, when implemented as a three-dimensional geometric structure, offers the facility to make three-dimensional measurements in real time. This embodiment of the invention is a technological step in the art and allows engineers to literally see the effect of changes in their design as they are made.

A further of embodiment of the invention, in the form of a multi-node antenna measurement system constructed as an open structure, is in automatic measurement systems where similar objects to be measured are conveyed inside the measurement system. (for example the production testing of mass-produced items such as mobile telephones and other wireless devices). Such a system would require the device under test (DUT) to be configured to transmit a signal prior to entering the system and to be configured to cease transmission having exited the system. The equalisation of the measurement path is performed either through a priori. I knowledge of the signal transmitted by the DUT, or by a separate calibration process from which the channel equalisation is derived.

For a multi node system means are provided for: generating a predetermined training signal, comparing the radiated signal within the received signal and generating a set of equaliser coefficients for each node, and storing the set of equaliser coefficients for each node.

In the case of a 3 dimensional distribution of nodes, the required equaliser coefficients may be computed at each node one after the other, or simultaneously where the hardware and software provides. In the case of non-3d multi node systems, relative rotation of the antenna under test with respect thereto is preformed to arrive at a number of sets of coefficients duly associated with the relative rotational position. Thus means is provided for correlating the relative rotational position with the set of equaliser coefficients for each position.

The embodiments described above are given as examples and it should be understood that the present invention is not limited thereto. For example, various hybrids of the illustrated embodiments can be realized. Further modifications, changes and improvements that retain the basic underlying principles disclosed and claimed herein are within the scope and spirit of the invention.

The present invention may be embodied in other specific forms than the embodiments described above without departing from the spirit or essential attributes of the invention. Accordingly, reference should be made to the appended claims, rather than the foregoing specification, as indicating the scope of the invention.

What is claimed is:

1. A measurement range adapted to measure an antenna radiation pattern, the measurement range comprising:
    an antenna under test;
    one or more spatially separated measurement nodes, each of said measurement nodes comprising one or more measurement antennas;
    wherein each measurement node antenna has an equalisation unit associated therewith;
    wherein the position and orientation of the antenna under test with respect to each of the said one or more measurement node antennas is pre-determined;
    wherein a pre-determined training signal is radiated by the antenna under test and received by at least one of the one or more measurement node antennas, said radiation having a primary direction of propagation,
    wherein said equalisation units are adapted to (a) compare the received training signal with the pre-determined training signal, (b) determine sets of equaliser coefficients for propagation channels between the antenna under test and each of the one or more measurement node antennas to eliminate or minimise the difference between the received training signal and the pre-determined training signal, and (c) operate as an inverse filter by applying the equaliser coefficients to generate an equalised version of a signal measured at each of the one or more measurement node antennas; and
    wherein sets of equalisation coefficients for a plurality of orientations and positions between the antenna under test relative to each of the one or more measurement nodes are determined.

2. The measurement range as claimed in claim 1, wherein the antenna under test and the measurement node antennas are adapted for relative translation or rotation of the primary direction of propagation to selected positions.

3. The measurement range as claimed in claim 2, further comprising a signal synchronisation unit adapted to synchronise source equipment and measurement equipment associated with the antenna under test and the one or more of the measurement nodes.

4. A measurement range adapted to measure an antenna radiation pattern, the measurement range comprising:
   an antenna under test, said antenna under test further comprising an equalisation unit;
   one or more measurement nodes, each of said measurement nodes comprising one or more measurement antennas;
   wherein the position and orientation of the antenna under test with respect to each of the said one or more measurement node antennas is pre-determined;
   wherein a pre-determined training signal is radiated in turn by one of the one or more measurement antennas, said radiation having a primary direction of propagation, and received by the antenna under test; and
   wherein said equalisation unit is adapted to (a) compare the received training signal with the pre-determined training signal, (b) determine a set of equaliser coefficients for propagation channels between the antenna under test and each of the one or more of measurement node antennas to eliminate or minimize the difference between the received training signal and the pre-determined training signal, and (c) operate as an inverse filter by applying the equaliser coefficients to generate an equalised version of a signal measured at the antenna under test;
   wherein each set of equaliser coefficients has a two or three dimensional spatial relationship with the antenna under test; and
   wherein sets of equalisation coefficients for a plurality of orientations and positions between the antenna under test relative to each of the one or more measurement nodes are determined.

5. The measurement range as claimed in claim 1, wherein the set of equaliser coefficients are determined by use of a recursive algorithm.

6. The measurement range as claimed in claim 1, wherein the spatially separated measurement nodes are arranged in a three dimensional distribution.

7. The measurement range as claimed in claim 1, wherein the measurement nodes are arranged either uniformly or irregularly in space.

8. The measurement range as claimed in claim 1, wherein the measurement nodes are uniformly spaced surrounding the antenna under test.

9. The measurement range as claimed in claim 1, wherein the measurement nodes are positioned at the vertices of a polyhedron.

10. The measurement range as claimed in claim 1, wherein the measurement nodes are spaced at equal distances from the antenna under test.

11. The measurement range as claimed in claim 4, wherein the set of equaliser coefficients are determined by use of a recursive algorithm.

12. The measurement range as claimed in claim 1, further comprising a tracking node comprising an antenna interface and a tracking receiver.

13. The measurement range as claimed in claim 1, further comprising a conveyor means to transport the antenna under test into its test position.

14. A method of calibrating a measurement range adapted to measure an antenna radiation pattern, the method comprising the steps of:
   providing an antenna under test;
   providing at least one measurement node, said at least one measurement node comprising one or more measurement antennas, wherein the position and orientation of the antenna under test with respect to each of the at least one measurement node antenna is predetermined;
   providing an equalisation unit adapted to generate an equalised version of a propagation channel between the antenna under test and each measurement node antenna;
   radiating a pre-determined training signal, the radiated signal having a primary direction of propagation;
   receiving the radiated training signal and in the equalisation unit comparing the received training signal with the pre-determined training signal;
   determining a set of equaliser coefficients for the propagation channel that allow the equalisation unit to be used as an inverse filter to eliminate or minimise the difference between the radiated training signal and the pre-determined training signal; and
   associating the set of equaliser coefficients with the position and orientation of the antenna under test with respect to each measurement node antenna and the primary direction of propagation of the one or more measurement antennas so that the equaliser coefficients can be applied to subsequent radiation pattern measurements for that position and orientation of the antenna under test with respect to the at least one measurement node antenna.

15. The method as claimed in claim 14, further comprising rotating or translating the position of the primary direction of propagation of the antenna under test to successive positions relative to the one or more measurement antennas, and wherein sets of equalizer coefficients for each position are determined.

16. The method as claimed in claim 14, wherein a plurality of measurement nodes are provided and a set of equaliser coefficients are determined for each propagation channel.

17. The method as claimed in claim 14, wherein the radiated training signal is a predetermined bit sequence.

18. The method as claimed in claim 14, wherein the radiated training signal is radiated by the antenna under test.

19. The method as claimed in claim 14, wherein the set of equaliser coefficients is determined by use of a recursive algorithm.

20. A method of calibrating a measurement range adapted to measure an antenna radiation pattern, the method comprising:
   providing an antenna under test;
   providing a plurality of spatially separated measurement nodes, each measurement node comprising one or more measurement antennas, wherein the position of the plurality of spatially separated measurement nodes with respect to the antenna under test is known, and wherein the orientation of the antenna under test with respect to each of the plurality of spatially separated measurement nodes is known;
   providing an equalisation unit adapted to generate an equalised version of a propagation channel between the antenna under test and the plurality of measurement nodes;
   radiating a pre-determined training signal;
   receiving the radiated training signal and comparing the received training signal with the pre-determined training signal;

determining sets of equaliser coefficients for propagation channels between the antenna under test and measurement antennas that allow the equalisation unit to be used as an inverse filter to eliminate or minimise the difference between the radiated training signal and the received training signal;

wherein the sets of equalisation coefficients have a two or three dimensional spatial relationship with the antenna under test; and wherein each set of equalization coefficients is associated with a position and orientation of the antenna under test and a measurement node with respect to each other.

21. The measurement range as claimed in claim 1, wherein the sets of determined equaliser coefficients are stored.

22. The measurement range as claimed in claim 4, wherein the sets of determined equaliser coefficients are stored.

23. The measurement range as claimed in claim 14, wherein the sets of determined equaliser coefficients are stored.

24. The measurement range as claimed in claim 20, wherein the sets of determined equaliser coefficients are stored.

25. The measurement range as claimed in claim 4, wherein the antenna under test and the measurement node antennas are adapted for relative translation or rotation of the primary direction of propagation to selected positions.

26. The measurement range as claimed in claim 25, further comprising a signal synchronisation unit adapted to synchronise source equipment and measurement equipment associated with the antenna under test and each of the at least one or more measurement node antennas.

* * * * *